(12) United States Patent
Escoffier et al.

(10) Patent No.: US 10,474,172 B2
(45) Date of Patent: Nov. 12, 2019

(54) CURRENT LIMITER FOR AC LOAD

(71) Applicant: Commissariat a l'energie atomique et aux energies alternatives, Paris (FR)

(72) Inventors: Rene Escoffier, La Buisse (FR); Thierry Bouchet, Corenc (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 248 days.

(21) Appl. No.: 15/710,277

(22) Filed: Sep. 20, 2017

(65) Prior Publication Data

US 2018/0081381 A1 Mar. 22, 2018

(30) Foreign Application Priority Data

Sep. 20, 2016 (FR) ...................................... 16 58825

(51) Int. Cl.
*G05F 1/56* (2006.01)
*G01R 1/36* (2006.01)
*H02H 9/02* (2006.01)

(52) U.S. Cl.
CPC ................. *G05F 1/56* (2013.01); *G01R 1/36* (2013.01); *H02H 9/02* (2013.01); *H02H 9/025* (2013.01)

(58) Field of Classification Search
CPC ...... H02M 3/35; H02M 3/33507; H02H 9/02; G01K 1/36; G05F 1/56
USPC .......................................... 361/18, 86, 91, 93
See application file for complete search history.

(56) References Cited

U.S. PATENT DOCUMENTS

| | | | |
|---|---|---|---|
| 3,707,708 A * | 12/1972 | Dan | ........................ H04M 11/04 340/503 |
| 5,684,663 A | 11/1997 | Mitter | |
| 6,445,144 B1 | 9/2002 | Wuidart et al. | |
| 7,355,867 B2 * | 4/2008 | Shuey | ........................ G05F 5/00 361/15 |

(Continued)

FOREIGN PATENT DOCUMENTS

| EP | 0 766 362 A2 | 4/1997 |
|---|---|---|
| EP | 0 895 443 A1 | 2/1999 |

(Continued)

OTHER PUBLICATIONS

French Preliminary Search Report dated May 26, 2017 in French Application 16 58825, filed on Sep. 20, 2016 (with English Translation of Categories of cited documents & Written Opinion).

*Primary Examiner* — Tuan T Dinh
(74) *Attorney, Agent, or Firm* — Oblon, McClelland, Maier & Neustadt, L.L.P.

(57) ABSTRACT

A protection circuit including an input interface; an output interface; a current sensor connected between an input terminal and an output terminal; first and second HEMT transistors of normally closed type connected in series with the current sensor and connected in series by way of a connection node; a transformer, a primary winding of which is connected to the terminals of the current sensor; a rectifier bridge exhibiting two input terminals connected to the terminals of a secondary winding of the transformer, and exhibiting output terminals, an output terminal of the rectifier bridge being connected to the control gates of the transistors, an output terminal of the rectifier bridge being connected to the connection node.

15 Claims, 4 Drawing Sheets

(56) References Cited

U.S. PATENT DOCUMENTS

| | | | |
|---|---|---|---|
| 2012/0146576 A1* | 6/2012 | Partovi | H01F 7/0252 320/108 |
| 2013/0285629 A1 | 10/2013 | Sobolewski | |
| 2014/0091059 A1* | 4/2014 | Henke | G01R 31/02 218/8 |

FOREIGN PATENT DOCUMENTS

| | | |
|---|---|---|
| FR | 3 024 010 A1 | 1/2016 |
| FR | 3 028 666 A1 | 5/2016 |

* cited by examiner

CURRENT LIMITER FOR AC LOAD

The invention relates to circuits for protecting electrical loads to be connected to AC networks, in particular circuits for protection in relation to the occurrence of failures such as short-circuits across the terminals of an electrical load.

Document U.S. Pat. No. 5,282,107 describes a circuit for protection against short-circuits. The protection circuit comprises a diode bridge rectifier. The alternating voltage is applied between two input terminals of the bridge. Between the output terminals of the bridge, a cutoff circuit and a primary winding of a transformer are connected in series. The load to be protected is intended to be connected to the terminals of a secondary winding of the transformer. The cutoff circuit comprises a probe for measuring voltage dip representative of an increase in the current. The probe is connected in series with a protection transistor. The voltage measurement is applied to a comparator. When the voltage dip exceeds a threshold, an opening signal is applied to the protection transistor.

Such a protection circuit exhibits drawbacks. On the one hand, this protection circuit does not make it possible to ensure continuity of service in case of failure, the load no longer being supplied upon the opening of the protection transistor. Moreover, the control is relatively poorly protected against failures of the AC network, and the load is only partially protected against failures at the level of the secondary winding.

Document EP0895443 describes a protection circuit for an electrical consumer. This circuit comprises an input interface comprising first and second input terminals for the application of an alternating potential difference, and an output interface comprising first and second output terminals for the connection of an electrical consumer. A current sensor is connected between the second input terminal and the second output terminal. First and second field-effect transistors of normally closed MOS type are connected in series with the current sensor between the second input terminal and the second output terminal, the first and second transistors being connected in series by way of a connection node.

This circuit does not make it possible to properly protect the control against failures of the AC network, or to ensure optimal protection of the load.

Document U.S. 2013/0285629 D2 describes a protection circuit connected to a DC source. This circuit includes a limiter with dual MOS transistors connected in series, with current measurement resistors and a diode bridge.

Document EP0766362 describes a protection circuit connected to a DC source. This circuit includes a limiter using two field-effect MOS transistors to limit the current.

Document FR3024010 describes a circuit having a series connection of 2 HEMT transistors.

Document FR3028666 describes a circuit cointegrating several HEMT transistors.

The invention is aimed at resolving one or more of these drawbacks. The invention thus pertains to a protection circuit for an electrical consumer, such as is defined in claim 1.

The invention also pertains to the variants of the dependent claims. The person skilled in the art will understand that each of the characteristics of the variants of the dependent claims can be combined independently with the characteristics of claim 1, without thereby constituting an intermediate generalization.

The invention also pertains to a protection circuit for an electrical consumer, such as is defined in the appended claims.

Other characteristics and advantages of the invention will emerge clearly from the description thereof given hereinafter, by way of wholly nonlimiting indication, with reference to the appended drawings, in which.

Figure 1:
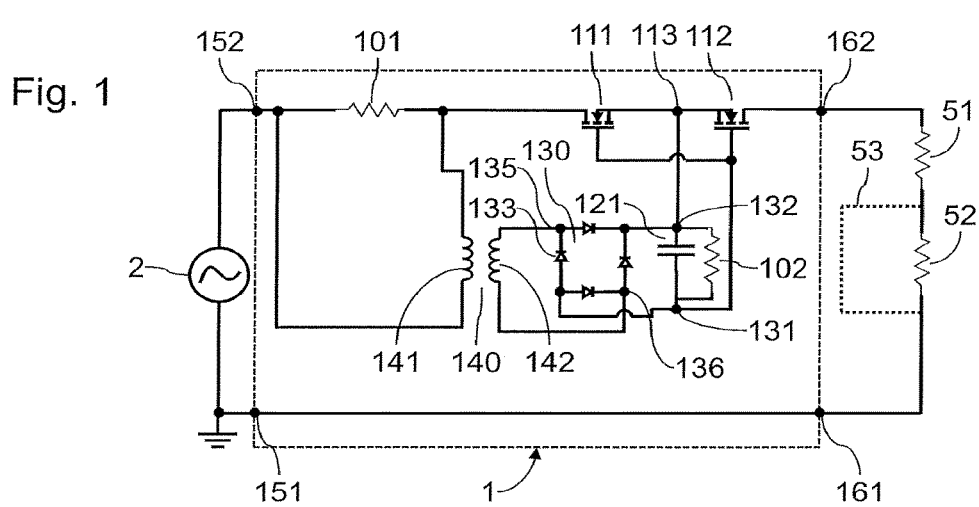
FIG. 1 is an electrical diagram of an example of a first embodiment of a protection circuit implemented for the protection of an electrical load.

FIG. 1 is an electrical diagram of an example of a first embodiment of a protection circuit 1. The protection circuit 1 has an input connected to an alternating voltage source 2, for example the mains AC network. The protection circuit 1 thus comprises an input comprising input terminals 151 and 152. The protection circuit 1 has an output connected to an electrical consumer or load 52. The protection circuit 1 thus comprises an output comprising output terminals 161 and 162. The protection circuit 1 can for example be integrated into a domestic current socket, the output terminals 161 and 162 being for example output terminals for the connection of domestic appliances, and the input terminals 151 and 152 being for example terminals for connection to an electrical panel by way of copper wires.

The protection circuit 1 comprises a current sensor 101 connected between the input terminal 152 and the output terminal 162. The current sensor 101 is for example implemented in the form of a resistor in the embodiment illustrated. The current sensor 101 can also be implemented in a nonlimiting manner in galvanic probe form or in Hall-effect probe form.

The protection circuit 1 also comprises a transistor 111 and a transistor 112 which are connected in series with the current sensor 101 between the input terminal 152 and the output terminal 162. The transistors 111 and 112 are of high electron mobility field-effect type, of normally closed type (or normally on, designated by N-On). These transistors can be replaced with a single transistor of bidirectional type such as that described in patent document U.S. 20140145203. The drain of the transistor 111 is connected to the resistor 101. The source of the transistor 111 is connected to the source of the transistor 112 by way of a connection node 113. The drain of the transistor 112 is connected to the output terminal 162.

The protection circuit 1 comprises a transformer 140. A primary winding 141 of the transformer 140 is connected to the terminals of the resistor 101. The transformer 140 moreover comprises a secondary winding 142.

The protection circuit 1 also comprises a rectifier bridge 130. The rectifier bridge 130 comprises input terminals 135 and 136. The secondary winding 142 is connected between these input terminals 135 and 136. The rectifier bridge 130 moreover comprises output terminals 131 and 132, between which an electrical load is connected. The electrical load connected between the output terminals 131 and 132 is here a circuit combining a resistor 102 and a capacitor 121 connected in parallel. The rectifier bridge 130 comprises in a manner known per se four rectification diodes 133, connected so as to form a full-wave rectifier diode bridge 130.

The gate of the transistors 111 and 112 is connected to the output terminal 131 of the rectifier bridge 130. The intermediate node 113 is connected to the output terminal 132 of the rectifier bridge 130. The connection node 113 thus applies a reference potential on the output terminal 132. On the basis of this potential, a potential is applied by the output terminal 131 on the gate of the transistors 111 and 112.

In normal operation, the transistors 111 and 112 of normally closed type are on (without any outside action on the gate) and exhibit an extremely reduced flow resistance, on account of the use of high electron mobility transistors 111 and 112. Thus, the losses in the protection circuit 1 in the absence of failure are extremely small. Through their series connection, the transistors 111 and 112 form a connection which is bidirectional in terms of current and voltage to supply the consumer 52 with AC.

To limit the losses in the protection circuit, the resistor 101 advantageously exhibits a resistance value at most equal to 2Ω, and preferably equal to 0.5Ω.

The combination of the resistor 101, of the transformer 140, of the rectifier bridge 130, and of the electrical load (combination of the resistor 102 and of the capacitor 121) forms a control of the transistors 111 and 112, with a view to carrying out current limitation.

A resistor 51 is here representative of the connection resistance or of the line resistance up to the electrical consumer 52. The line 53 symbolizes a short-circuit circumventing the electrical consumer 52 during a failure.

Thus, upon the occurrence of a short-circuit between the output terminals 161 and 162 (or upon the occurrence of an overcurrent for any other reason between the terminals 152 and 162, for example a discharging of an inductance without inducing an arc current), the current through the resistor 101 exceeds the nominal current. This overcurrent increases the potential difference across the terminals of the resistor 101. The potential difference applied across the terminals of the primary winding 141 is thus increased, and consequently the potential difference across the terminals of the secondary winding 142 is also increased. When the potential difference across the terminals of the secondary winding 142 exceeds twice the threshold voltage of the diodes 133, a potential difference occurs between the terminals 131 and 132, that is to say across the terminals of the resistor 102 and of the capacitor 121. The closer this potential difference between the terminals 131 and 132 gets to the threshold voltage of the transistors 111 and 112, the more significant the current limitation exerted by the transistors 111 and 112. The current passing through the transistors 111 and 112 thus ensures both their control and their own protection by current limitation. The gate control of the transistors 111 and 112 is isolated by way of the transformer 140, thereby guaranteeing its protection. Moreover, this potential is well referenced with respect to the potential of the connection node 113, independently of the current flowing through the transistors 111 and 112.

Such a configuration thus makes it possible to run counter to a technical assumption of the person skilled in the art, high electron mobility transistors being considered to be rather unsuitable for resisting overcurrents (overcurrents often tolerated for a duration of less than 10 µs), and therefore rather unsuitable for such a protection application for the transistors 111 and 112 in relation to short-circuits.

Current limitation makes it possible to protect both the current consumer 52 and the voltage source 2, so as to be able to ensure continuity of service, instead of cutting off the current between the terminals 152 and 162. Subsequent to the malfunction, the protection circuit 1 can guarantee a resumption of normal operation, the current limitation being interrupted as soon as the overcurrent through the protection circuit 1 disappears. Moreover, despite everything the failure remains detectable, so that a protection device disposed for example in an electrical panel can take a corrective measure in relation to the failure. Furthermore, the protection circuit 1 makes it possible to ensure current limitation for the two alternations of the AC current.

The use of the capacitor 121 makes it possible to monitor the value of short-circuit current, so as to favour its detection in certain applications. The capacitor 121 will be able for example to exhibit a capacitance of 10 µF, in the form of a surface-mounted component remaining relatively easy to include in the integrated circuit 1.

The transformer 140 will advantageously exhibit a voltage transformation ratio of between 0.5 and 1.

Figure 2:
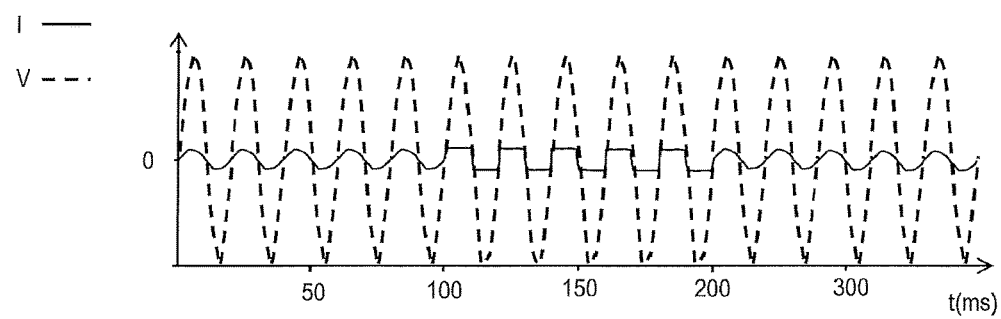
FIG. 2 is a chart illustrating the influence of a variant of the protection circuit of the first embodiment on the output current as a function of its activation (enlarged scale in regard to activation and deactivation)

Advantageously, so as to preserve a value of current limitation fairly close to the nominal current and thus avoid risks of deterioration, the threshold voltage of the transistors 111 and 112 advantageously has an amplitude at most equal to 2 V. In the chart of FIG. 2, normal operation at the nominal current is observed between the instants 0 and 100 ms. Between the instants 100 and 200 ms, a short-circuit is created between the output terminals 161 and 162. With transistors 111 and 112 exhibiting here a threshold voltage of −1.8 V, the amplitude of the current through the transistors 111 and 112 in case of failure remains close to the nominal current, here of the order of 110%. Other safety devices are thus granted a very long time to afford a solution to the malfunction (for example a cutoff by a circuit breaker or a disconnection of the consumer 52). Simulations have been performed with a resistor 101 with a value of 0.5Ω, a resistor 51 with a value of 1 mΩ, a resistor 52 with a value of 10Ω, a sinusoidal voltage source 2 of 50 V at 50 Hz. For a current of 10 A, the potential difference across the terminals of the resistor 101 is then 5 V. With a transformer 140 exhibiting a transformation ratio of 1, one and the same potential difference of 5 V is applied between the terminals 135 and 136.

Figure 3:
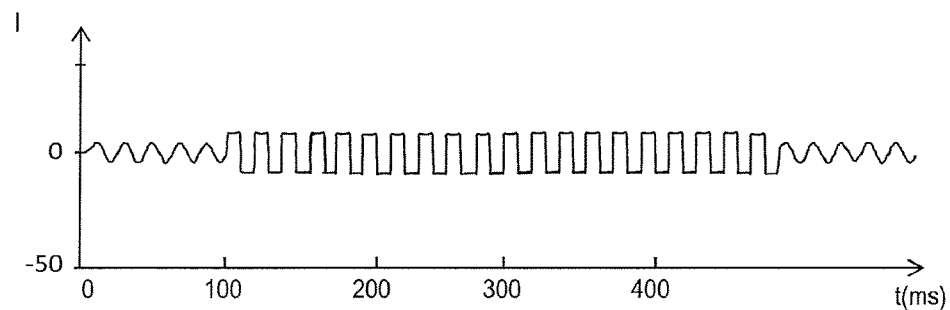
FIG. 3 is a chart illustrating the influence of another variant of the protection circuit of the first embodiment on the voltage and the output current as a function of its activation.

In the chart illustrated in FIG. 3, operation at the nominal current is also observed between the instants 0 and 100 ms. Between the instants 100 ms and 500 ms, a short-circuit is created between the output terminals 161 and 162. In this variant of the first embodiment, the transistors 111 and 112 exhibit a threshold voltage of −2.8 V. The amplitude of the current through the transistors 111 and 112 in case of failure is slightly higher than in the example of FIG. 4, of the order of 170% of the nominal current. The output voltage is here also illustrated, shown dashed.

The connection node 113 will be able to be formed in a continuous electron gas layer between the transistors 111 and 112.

The transistors 111 and 112 will be able to exhibit a heterojunction formed on the basis of a combination of layers of material of type III-N, including for example GaN. Lateral GaN-based transistors are very suitable for a symmetric realization of the transistors 111 and 112 sharing a source connected to the connection node 113.

Advantageously, the diodes 133 each consist of a high electron mobility field-effect transistor of normally open type, whose source and gate are connected. Such a configuration makes it possible to produce transistors 111 and 112 cointegrated with the rectifier bridge 130 on one and the same substrate, so as to benefit from optimized footprint and optimized fabrication cost. Moreover, in such a configuration, the protection by current limitation intervenes very rapidly, the current through the transistors 111 and 112 ensuring their own control by way of other cointegrated components.

Advantageously, the resistor 102 consists of a high electron mobility field-effect transistor of normally open type with negative threshold voltage, whose source and gate are connected. Such a configuration makes it possible to produce transistors 111 and 112 cointegrated with the resistor 102 on one and the same substrate, so as to benefit from optimized footprint and optimized fabrication cost.

In order to favour the integration of the transformer 140 into the integrated circuit 1, the latter is preferably of superposed planar type.

Figure 4:
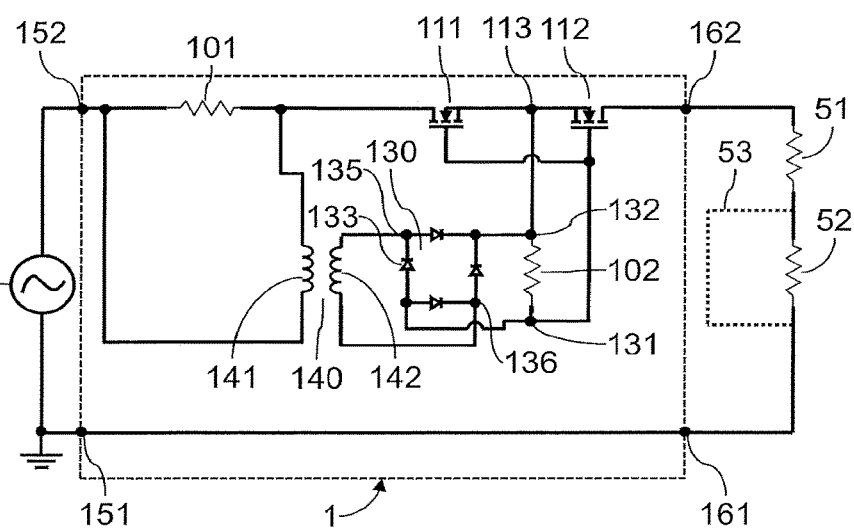
FIG. 4 is an electrical diagram of an example of a second embodiment of a protection circuit implemented for the protection of an electrical load.

FIG. 4 is an electrical diagram of an example of a second embodiment of a protection circuit 1. This second embodiment is aimed especially at facilitating the integration of the protection circuit 1. The protection circuit 1 differs from that of the first embodiment by the structure of the electrical load connected between the output terminals 131 and 132 of the rectifier bridge 130. This electrical load consists here of a resistor 102. Just as for the first embodiment, the resistor 102 consists of a high electron mobility field-effect transistor of normally open type with negative threshold voltage, whose source and gate are connected.

Figure 5:
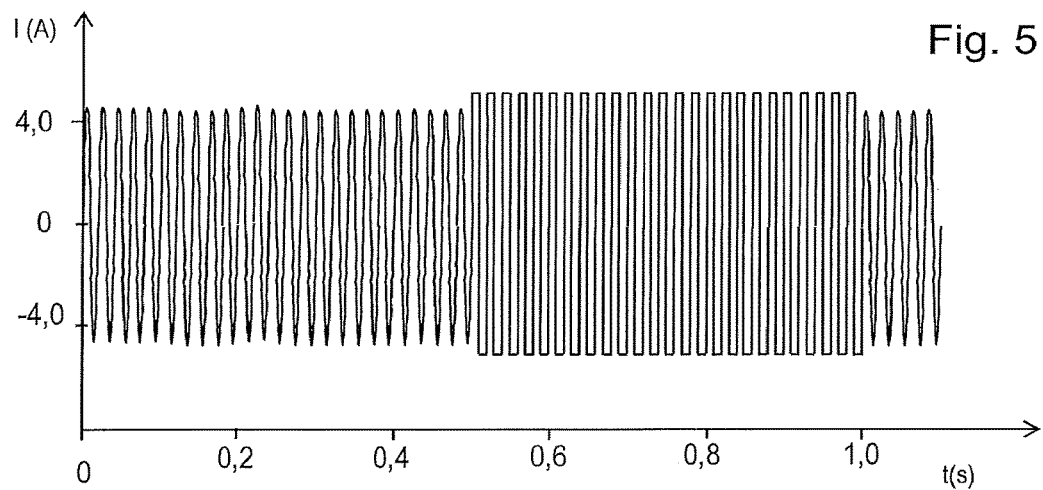
FIG. 5 is a chart illustrating the influence of a variant of the protection circuit of the second embodiment on the output current as a function of its activation.

Here, the threshold voltage of the transistors 111 and 112 advantageously has an amplitude at most equal to 2 V. In the chart of FIG. 5, normal operation at the nominal current is observed between the instants 0 and 500 ms. Between the instants 500 and 1000 ms, a short-circuit is created between the output terminals 161 and 162. With transistors 111 and 112 exhibiting here a threshold voltage of −1.8 V, the amplitude of the current through the transistors 111 and 112 in case of failure remains close to the nominal current, here of the order of 110%. Here also, other safety devices are granted a very long time to afford a solution to the malfunction. Simulations have been performed with a resistor 101 with a value of 0.5Ω, a resistor 51 with a value of 1 mΩ, a resistor 52 with a value of 10Ω, a sinusoidal voltage source 2 of 50 V at 50 Hz. For a current of 10Ω, the potential difference across the terminals of the resistor 101 is then 5 V. With a transformer 140 exhibiting a transformation ratio of 1, one and the same potential difference of 5 V is applied between the terminals 135 and 136.

Figure 6:
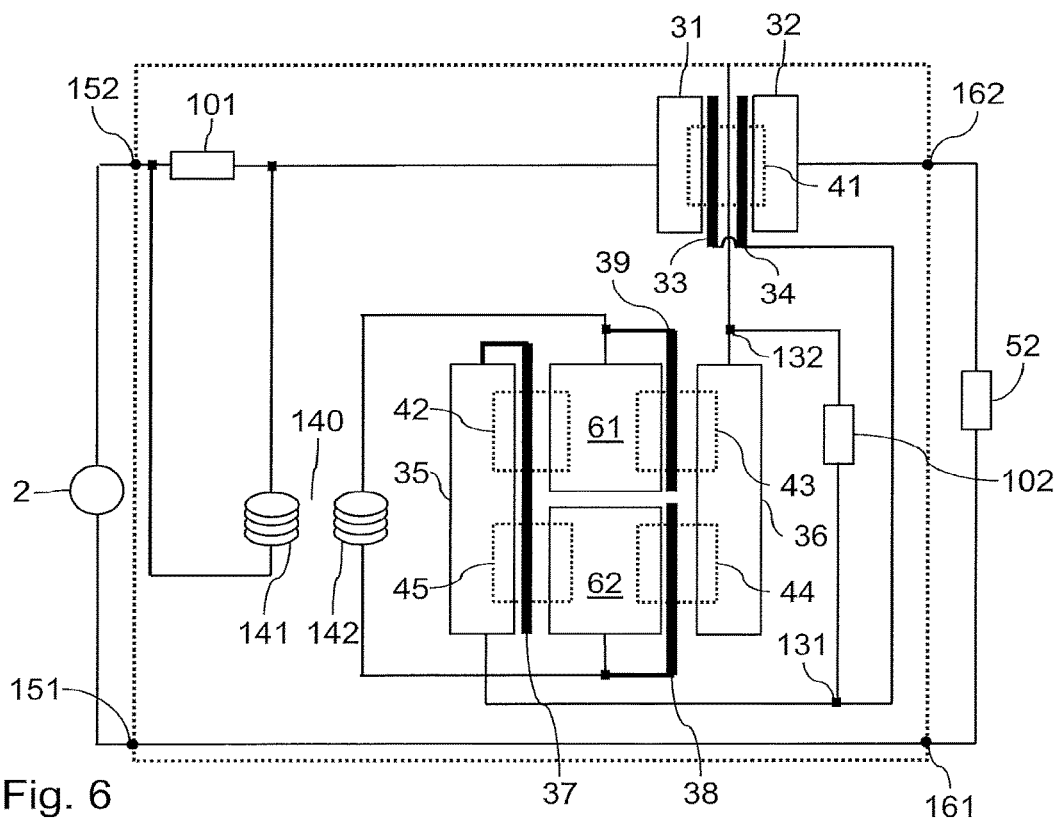
FIG. 6 is a figure schematically illustrating the integration of the protection circuit on the basis of high electron mobility transistors.

FIG. 6 illustrates in a schematic manner the integration of a protection circuit 1 according to the first embodiment, with an alternating voltage source 2 connected between its input terminals 151 and 152. The protection circuit 1 has an output interface connected to an electrical consumer 52.

An electrode 31 forms a drain of the transistor 111 and is connected to the current sensor 101. An electrode 32 forms a drain of the transistor 112 and is connected to the output terminal 162. An electron gas layer 41 is connected by two ends to the electrode 31 and to the electrode 32 and extends continuously between these electrodes 31 and 32. Gate electrodes 33 and 34 are formed plumb with the electron gas layer 41 between the electrodes 31 and 32. A connection node between the heterojunction transistors is intrinsically formed in the electron gas layer 41 between the gate electrodes 33 and 34. The gate electrodes are connected to the output terminal 31.

An electrode 35 forms a common source of two diode-connected heterojunction transistors. The electrode 35 is connected to the output terminal 131. An electrode 36 forms a common drain of two other diode-connected heterojunction transistors. The electrode 36 is connected to the output terminal 132. Here a rectifier bridge is formed with four diodes, each of these diodes consisting of a respective heterojunction transistor. A common electrode 61 forms an electrode common to two of the heterojunction transistors, thus forming the drain of one, and the source of the other. The electrode 61 is positioned between the electrodes 35 and 36. Another common electrode 62 forms an electrode common to two of the heterojunction transistors, thus forming the drain of one, and the source of the other. The electrode 62 is positioned between the electrodes 35 and 36.

An electron gas layer 42 is connected by two ends to the electrode 35 and to the electrode 61 and extends continuously between these electrodes 35 and 61. An electron gas layer 43 is connected by two ends to the electrode 61 and to the electrode 36 and extends continuously between these electrodes 61 and 36. An electron gas layer 44 is connected by two ends to the electrode 62 and to the electrode 36 and extends continuously between these electrodes 62 and 36. An electron gas layer 45 is connected by two ends to the electrode 35 and to the electrode 62 and extends continuously between these electrodes 35 and 62.

A gate electrode 37 is formed plumb with the electron gas layer 42 between the electrodes 35 and 61. The gate electrode 37 is also formed plumb with the electron gas layer 45 between the electrodes 35 and 62. A gate electrode 39 is formed plumb with the electron gas layer 43 between the electrodes 61 and 36. A gate electrode 38 is formed plumb with the electron gas layer 44 between the electrodes 62 and 36.

The gate electrodes 37 and 39 are connected to a first terminal of the secondary winding 142, the gate electrode 38 is connected to a second terminal of the secondary winding 142.

The electron gas layers 41 to 45 are illustrated dotted, to illustrate that they can be formed on the basis of one and the same substrate and be insulated from one another by photolithography steps.

Figure 7:
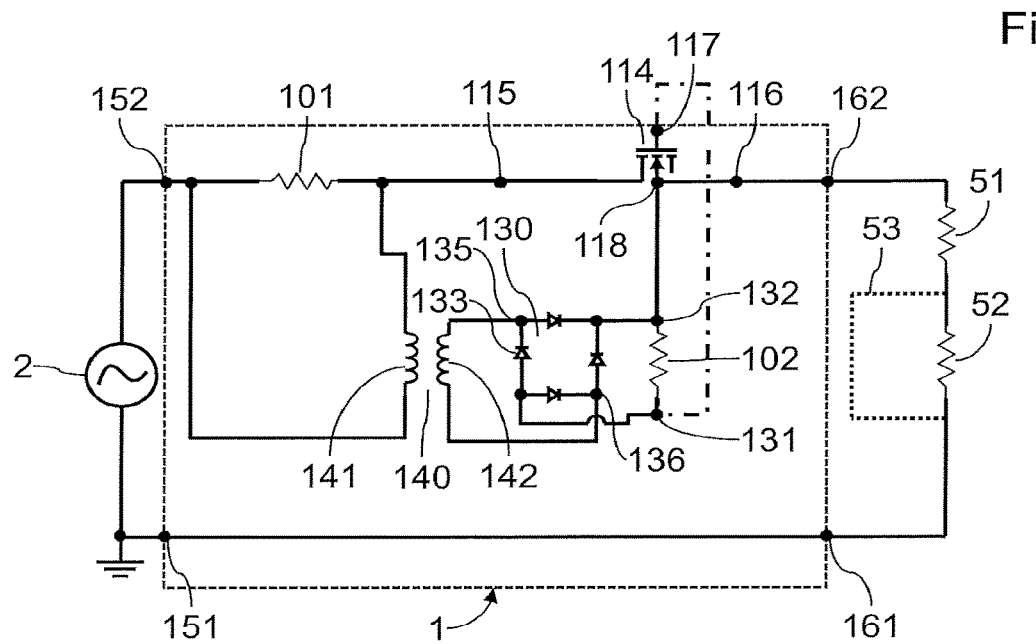
FIG. 7 is an electrical diagram of an example of a third embodiment of a protection circuit implemented for the protection of an electrical load.

FIG. 7 is an electrical diagram of an example of a third embodiment of a protection circuit 1. This third embodiment is aimed at replacing the transistors 111 and 112 of the first and second embodiments with a bidirectional transistor 114, such as that described in document EP2736078. The third embodiment is presented here as a spinoff of the second embodiment but the bidirectional transistor presented here can also be used as a replacement for the transistors 111 and 112 of the first embodiment.

The protection circuit 1 has an input connected to an alternating voltage source 2 and thus comprises an input comprising input terminals 151 and 152. The protection circuit 1 has an output connected to an electrical consumer or load 52 and thus comprises an output comprising output terminals 161 and 162.

The protection circuit 1 comprises a current sensor 101 connected between the input terminal 152 and the output terminal 162, as is detailed in the previous embodiments.

The protection circuit 1 also comprises a bidirectional transistor 114. The transistor 114 is of high electron mobility field-effect type, of normally closed type. The transistor 114 includes in a manner known per se an electron gas layer. The drain 115 of the transistor 114 is connected to the resistor 101. The source 116 of the transistor 114 is connected to the output terminal 162. The transistor 114 moreover comprises a reference electrode 118 plumb with its electron gas layer, between the electrodes 115 and 116. The reference electrode 118 is at the potential of the electron gas layer situated plumb therewith. As described in document EP2736078, the electrode 118 is made in a semi-conducting layer of the transistor 114, and connected electrically to the electron gas layer situated plumb therewith, either by direct connection, or by connection by tunnel effect.

The protection circuit 1 comprises a transformer 140 whose primary winding 141 is connected to the terminals of the resistor 101. The transformer 140 moreover comprises a secondary winding 142.

The protection circuit 1 also comprises a rectifier bridge 130 with input terminals 135 and 136 between which the secondary winding 142 is connected. The rectifier bridge 130 moreover comprises output terminals 131 and 132, between which a resistor 102 is connected. The resistor 102 can consist of a high electron mobility field-effect transistor of normally open type with negative threshold voltage, whose source and gate are connected. The rectifier bridge 130 comprises four rectification diodes 133, connected so as to form a full-wave rectifier diode bridge 130.

The gate 117 of the transistor 114 is connected to the output terminal 131 of the rectifier bridge 130. The reference electrode 118 is connected to the output terminal 132 of the rectifier bridge 130. The reference electrode 118 thus applies a reference potential on the output terminal 132. On the basis of this potential, a potential is applied by the output terminal 131 on the gate 117 of the transistor 114.

During normal operation, the transistor 114 of normally closed type is on (without any outside action on the gate 117) and exhibits an extremely small flow resistance, on account of the use of a high electron mobility transistor 114. Thus, the losses in the protection circuit 1 in the absence of failure are extremely small.

The invention claimed is:

1. A protection circuit for an electrical consumer, comprising:
    an input interface comprising first and second input terminals for the application of an alternating potential difference;
    an output interface comprising first and second output terminals for the connection of an electrical consumer;
    a current sensor connected between the second input terminal and the second output terminal;
    further comprising:
    first and second high electron mobility field-effect transistors of normally closed type connected in series with the current sensor between the second input terminal and the second output terminal, the first and second transistors being connected in series by way of a connection node;
    a transformer, a primary winding of which is connected to the terminals of the current sensor, and comprising a secondary winding;
    a rectifier bridge exhibiting two input terminals connected to the terminals of the said secondary winding, and exhibiting first and second output terminals between which an electrical load is connected, the first output terminal of the rectifier bridge being connected to a control gate of the first transistor and to a control gate of the second transistor, the second output terminal of the rectifier bridge being connected to said connection node.

2. The protection circuit for an electrical consumer according to claim 1, wherein said first and second transistors each exhibit a threshold voltage having an amplitude at most equal to 2 V.

3. The protection circuit for an electrical consumer according to claim 1, wherein said rectifier bridge includes a diode bridge.

4. The protection circuit for an electrical consumer according to claim 3, wherein each diode of the diode bridge comprises a high electron mobility field-effect transistor of normally open type whose source and gate are connected.

5. The protection circuit for an electrical consumer according to claim 4, wherein said first and second transistors and the transistors of the diode bridge are cointegrated on one and the same substrate.

6. The protection circuit for an electrical consumer according to claim 1, wherein said current sensor is a resistor across the terminals of which the said primary winding of the transformer is connected.

7. The protection circuit for an electrical consumer according to claim 6, wherein said resistor exhibits a resistance value of at most 2 Ω.

8. The protection circuit for an electrical consumer according to claim 1, wherein said electrical load connected between the said first and second output terminals of the rectifier bridge comprises a resistor.

9. The protection circuit for an electrical consumer according to claim 1, wherein said electrical load connected between said first and second output terminals of the rectifier bridge comprises a resistor connected in parallel with a capacitor.

10. The protection circuit for an electrical consumer according to claim 8, wherein said resistor comprises a high electron mobility field-effect transistor of normally open type with negative threshold voltage whose source and gate are connected.

11. The protection circuit for an electrical consumer according to claim 1, wherein the voltage transformation ratio between the primary winding and the secondary winding of the transformer lies between 0.5 and 1.

12. The protection circuit for an electrical consumer according to claim 1, wherein said first and second transistors include a heterojunction formed on the basis of a GaN layer.

13. A protection circuit for an electrical consumer, comprising:
    an input interface comprising first and second input terminals for the application of an alternating potential difference;
    an output interface comprising first and second output terminals for the connection of an electrical consumer;
    a current sensor connected between the second input terminal and the second output terminal;
    further comprising:
    a high electron mobility field-effect bidirectional transistor of normally closed type comprising an electron gas layer, said transistor being connected in series by first and second conduction electrodes between the second input terminal and the second output terminal, the current sensor measuring the current passing through the bidirectional transistor, said bidirectional transistor comprising a reference electrode disposed plumb with the electron gas layer in an intermediate position between the first and second conduction electrodes, and the reference electrode being at the potential of the electron gas layer situated plumb therewith;

a transformer, a primary winding which is connected to the terminals of the current sensor, and comprising a secondary winding;

a rectifier bridge exhibiting two input terminals connected to the terminals of said secondary winding, and exhibiting first and second output terminals between which an electrical load is connected, the first output terminal of the rectifier bridge being connected to a control gate of the bidirectional transistor, the second output terminal of the rectifier bridge being connected to said reference electrode.

14. The protection circuit for an electrical consumer according to claim 13, wherein each diode of the diode bridge comprises a high electron mobility field-effect transistor of normally open type whose source and gate are connected.

15. The protection circuit for an electrical consumer according to claim 14, wherein said bidirectional transistor and the transistors of the diode bridge are cointegrated on one and the same substrate.

* * * * *